United States Patent [19]

Ueno et al.

[11] Patent Number: 5,066,875
[45] Date of Patent: Nov. 19, 1991

[54] SIGNAL OUTPUT CIRCUIT HAVING BIPOLAR TRANSISTORS AT OUTPUT, FOR USE IN A MOS SEMICONDUCTOR INTEGRATED CIRCUIT

[75] Inventors: Masaji Ueno, Chofu; Kumi Ofusa, Yokohama, both of Japan

[73] Assignee: Kabushiki Kaisha Toshiba, Kawasaki, Japan

[21] Appl. No.: 592,236

[22] Filed: Oct. 3, 1990

[30] Foreign Application Priority Data

Oct. 6, 1989 [JP] Japan .................................. 1-261577

[51] Int. Cl.⁵ ..................... H03K 19/096; H03K 17/16
[52] U.S. Cl. .................................... 307/446; 307/475; 307/542; 307/548; 307/570
[58] Field of Search ............... 307/448, 451, 446, 475, 307/542, 546–548, 570

[56] References Cited

U.S. PATENT DOCUMENTS 4,837,462  6/1989  Watanabe et al. ................... 307/475
4,902,914  2/1990  Masuoka ............................. 307/446

*Primary Examiner*—Stanley D. Miller
*Assistant Examiner*—Margaret Rose Wambach
*Attorney, Agent, or Firm*—Banner, Birch, McKie & Beckett

[57] ABSTRACT

Disclosed herein is a signal output circuit designed for use in a CMOS IC and having a bipolar transistor at output. A high-level output NPN-type bipolar transistor has its collector-emitter path connected between a node to which a high-level power-supply potential is applied, and an output node for outputting a signal. A low-level output NPN-type bipolar transistor has its collector-emitter path connected between the output node and a node to which a low-level power-supply potential is applied. An N-channel MOS transistor has its source-drain path connected between the output node and the base of the bipolar transistor, and is controlled by a first input signal. An N-channel MOS transistor has its source-drain path connected between the output node and the node to which the low-level power-potential is applied. A control signal output by a control signal generating circuit is supplied to the gate of this MOS transistor, and is turned on when the signal at the output node falls to a sufficiently low level after the bipolar transistor has been turned on.

13 Claims, 3 Drawing Sheets

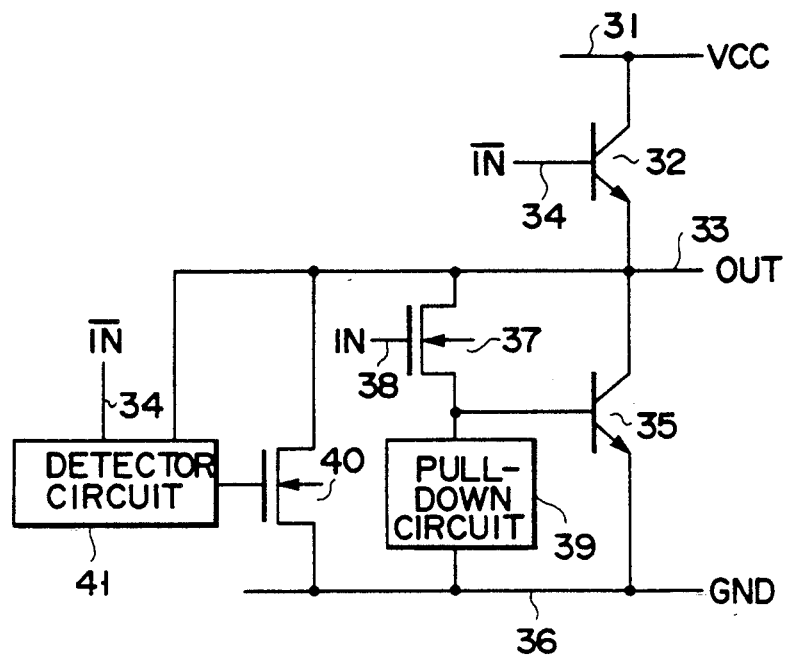
F I G. 3
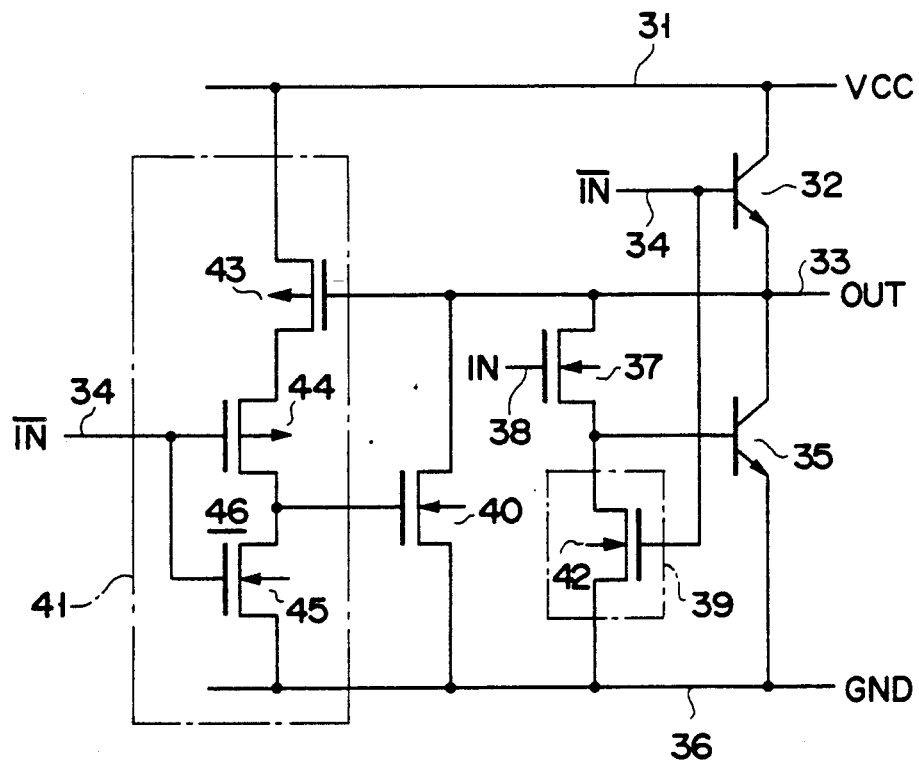
F I G. 4

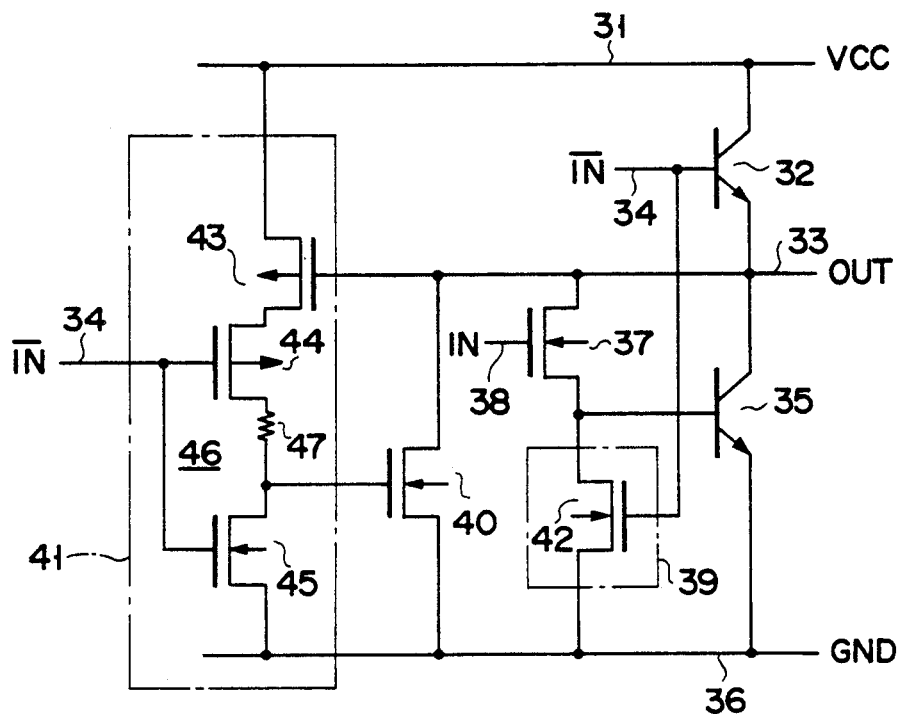
F I G. 5
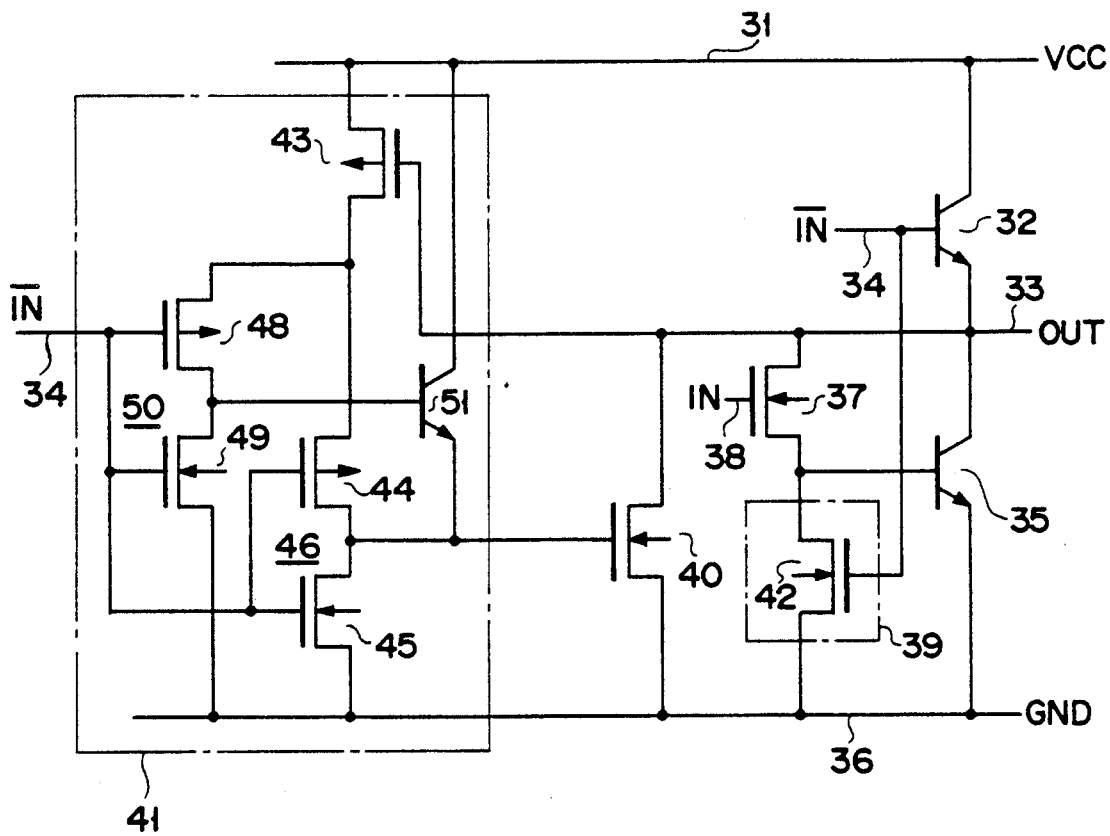
F I G. 6

SIGNAL OUTPUT CIRCUIT HAVING BIPOLAR TRANSISTORS AT OUTPUT, FOR USE IN A MOS SEMICONDUCTOR INTEGRATED CIRCUIT

BACKGROUND OF THE INVENTION

1. Field of the Invention

The present invention relates to a signal output circuit to be incorporated into a MOS semiconductor integrated circuit (IC) designed to drive bus lines. More particularly, it relates to a signal output circuit made in the form of a Bi-MOS IC comprising bipolar transistors and MOS transistors.

2. Description of the Related Art

An Bi-MOS signal output circuit which outputs signal at a TTL (Transistor-Transistor Logic) level has two bipolar transistors at its output. These bipolar transistors are controlled by the signal output by a control circuit comprising MOS transistors.

FIG. 1 shows a conventional signal output circuit of this type, which comprises an N-channel MOS transistor 11, a Schottky-junction NPN-type bipolar transistor 12, a resistor 13, and an NPN-type bipolar transistor 14. While the input signal IN is at a "H" level, the N-channel MOS transistor 11 remains on. In this condition a base current flows from a power-supply potential VCC through the resistor 13 to the NPN-type bipolar transistor 12 and the bipolar transistor 12 is turned on. As a result of this, the node of the bipolar transistors 12 and 14, i.e., the output terminal, is discharged to the ground potential GND, whereby the output signal OUT is set at a "L" level.

On the other hand, while the input signal IN is at the "L" level, the MOS transistor 11 remains off. In this condition, a base current flows from the power-supply potential VCC through the resistor 13 to the NPN-type bipolar transistor 14, and the transistor 14 is therefore turned on. Hence, the node of the transistor 12 and 14 is charged with the power-supply potential VCC, whereby the output signal OUT is set at the "H" level.

As is shown in FIG. 1, the conventional signal output circuit further comprises a pull-down circuit 15 which is connected between the ground potential GND and the node of the MOS transistor 11 and the bipolar transistor 12. The pull-down circuit 15 discharges the base of the bipolar transistor 12 to the ground potential GND when the MOS transistor 11 is cut off, thus setting the base of the bipolar transistor 12 into a floating state. Its base thus discharged, the bipolar transistor 12 is quickly turned off.

To increase the output sink current required to set the output signal OUT at the "L" level, it suffices to increase the base current of the bipolar transistor 12. To increase this base current, it suffices to use, as resistor 13, a resistor having a low resistance. Thus, the power of this signal output circuit consumes increases in proportion to the output current.

The lead electrodes and the like of an IC package incorporating the signal output circuit (FIG. 1) have inductance components. When the signal output circuit drives a load having the inductance components and also capacitance components, the waveform of the output signal OUT of the signal output circuit will likely to contain a ringing component. Nevertheless, the bipolar transistor 12 can absorb the ringing component sufficiently since it exhibits non-linear characteristic and has a high resistance when the output signal OUT is at about 0 V. In other words, the signal output circuit (FIG. 1) outputs a signal containing, if any, an extremely small ringing component.

FIG. 2 illustrates another conventional signal output circuit which comprises an NPN-type bipolar transistor 21, an N-channel MOS transistor 22, an NPN-type bipolar transistor 23, and an N-channel MOS transistor 24. While input signals $\overline{IN}$, IN are at the "H" level and the "L" level, respectively, the NPN-type bipolar transistor 21 remains on, whereby the node of the bipolar transistors 21 and 23 is charged by the power-supply potential VCC. As a result, the output signal OUT is set at the "H" level. Conversely, while the input signal IN is at the "H" level, the N-channel MOS transistor 22 is on, whereby a base current flows from the node of the transistors 21 and 23 to the bipolar transistor 23. Hence, the bipolar transistor 23 is turned on, and the node of the transistors 21 and 23 is discharged to the ground potential GND. Meanwhile, upon receipt of the input signal IN at the "H" level, the MOS transistor 24 is turned on, and the node is also discharged to the ground potential GND also via this MOS transistor 24. Therefore, the node of the bipolar transistors 21 and 23 is discharged to the "L" level through two transistors, i.e., the bipolar transistor 23 and the MOS transistor 24.

The signal output circuit shown in FIG. 2 further comprises a pull-down circuit 25 which performs the same function as the pull-down circuit 15 incorporated i the signal output circuit illustrated in FIG. 1.

In the conventional circuit shown in FIG. 2, in order to set the output signal OUT at the "L" level, a current is accumulated in two current paths formed of the bipolar transistor 23 and the MOS transistor 24, respectively. Unlike in the signal output circuit shown in FIG. 1, no currents always flow between the power-supply potential VCC and the ground potential GND. Therefore, the circuit of FIG. 2 consumes but power as little as is consumed by a CMOS logic IC. In addition, the sink current required to set the output signal OUT at the "L" level can be increased, merely by using a large element for the bipolar transistor 23, which therefore has a low on-resistance. Hence, the circuit does not consume as much power as does the signal output circuit illustrated in FIG. 1. However, the circuit is disadvantageous in that the bipolar transistor 23 cannot absorb the ringing component of the output signal when the circuit drives a load containing inductance components and capacitance components. This is because the on-resistance of the bipolar transistor 23 is low when the output signal OUT is at about 0 V. In other words, the output signal OUT is very likely to have a waveform containing a ringing component.

As has been pointed out, either conventional signal output circuit described above can accomplish both things required of this kind of circuit, i.e., an decrease in power consumption and a reduction in the ringing component in the output signal.

SUMMARY OF THE INVENTION

It is accordingly an object of this invention to provide a signal output circuit which has a great ability of driving a load and can yet suppress the ringing component contained in an output signal.

It is another object of the present invention to provide a signal output circuit which consumes as little power as does a CMOS integrated circuit.

According to the present invention, there is provided a signal output circuit for use in a MOS integrated circuit, comprising: a first node for receiving an input signal; a second node to which a first power-supply potential is applied; a first bipolar transistor of a first polarity having a base and collector-emitter path connected between the first and second nodes; a first MOS transistor of the first polarity having a source-drain path connected between the first node and the base of the first bipolar transistor; a second MOS transistor of a first polarity having a gate and a source-drain path connected between the first and second nodes; and a control signal generating means for generating and supplying a control signal to the gate of the second MOS transistor, thereby to turn off the second MOS transistor while the signal at the first node is falling from a high level, and turn on the second MOS transistor when the signal at the first node falls to a low level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a diagram representing a signal output circuit according to a first embodiment of the present invention;

FIG. 4 is a diagram illustrating the circuit of FIG. 3 in greater detail;

FIG. 5 is a diagram showing a signal output circuit according to a second embodiment of the present invention; and FIG. 6 is a diagram illustrating a signal output circuit according to a third embodiment of the present invention.

DETAILED DESCRIPTION OF THE PREFERRED EMBODIMENTS

Figure 1:
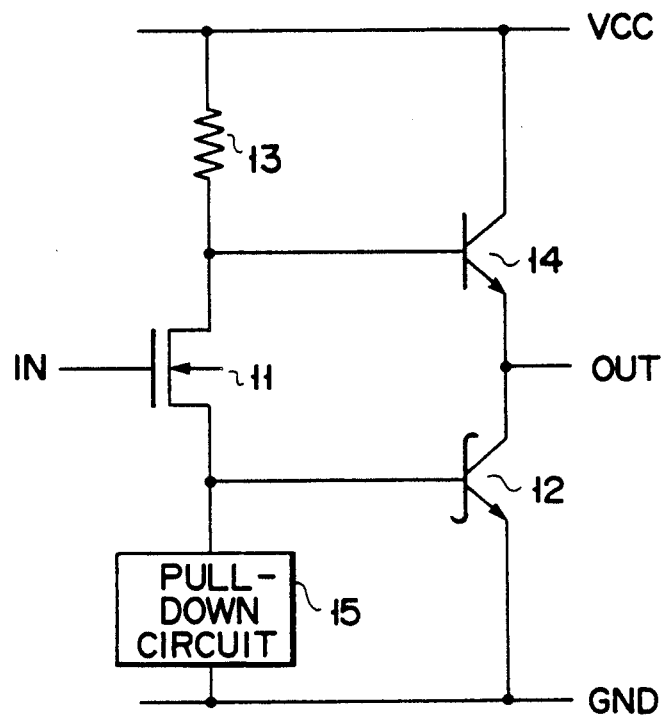
FIG. 1 is a diagram showing a conventional signal output circuit.
Figure 2:
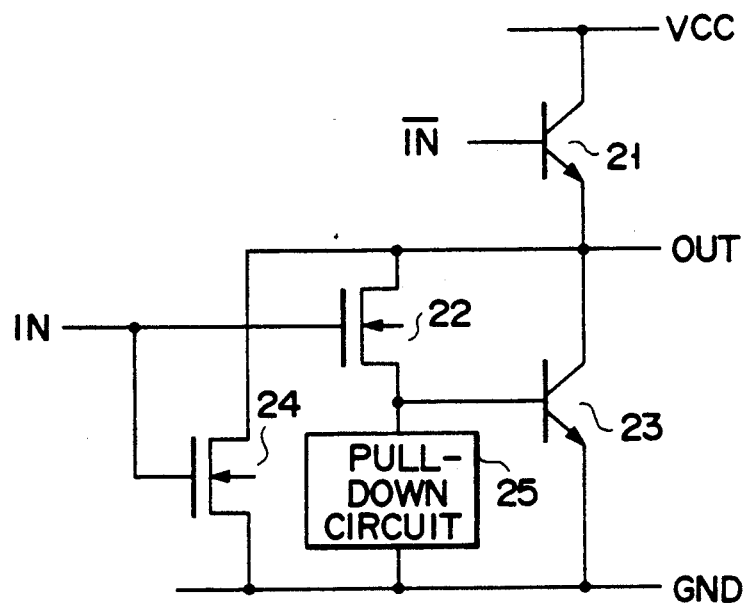
FIG. 2 is a diagram illustrating another conventional signal output circuit.

The present invention will now be described in detail, with reference to some embodiments.

FIG. 3 is a Bi-MOS signal output circuit, which is a first embodiment of the invention and designed for use in a MOS integrated circuit (IC) used as a bus driver.

As FIG. 3 shows, a power-supply voltage VCC is applied to a node 31. The node 31 is connected to the collector of an NPN-type bipolar transistor 32. The emitter of the NPN-type bipolar transistor 32 is connected to a node 33, from which a signal OUT will be output. The base of the bipolar transistor 32 is connected to a node 34, to which an input signal $\overline{IN}$ is supplied. The node 33 is coupled to the collector of an NPN-type bipolar transistor 35. The emitter of this bipolar transistor 35 is connected to a node 36, to which a ground potential GND is applied.

The node 33 is also connected to the drain of an N-channel MOS transistor 37. The source of the MOS transistor 37 is coupled to the base of the bipolar transistor 35. The gate of the MOS transistor 37 is connected to a node 38, to which an input signal IN is supplied. A pull-down circuit 39 is connected between the base of the bipolar transistor 35 and the node 36. The pull-down circuit 39 discharges the base of the bipolar transistor 35 to the ground potential GND after the transistor 35 has been turned off.

The drain of an N-channel MOS transistor 40 is coupled to the node 33. The source of this MOS transistor 40 is connected to the ground potential GND. The gate of the transistor 40 is connected to receive the signal output by a detector circuit 41. The detector circuit 41 generates a control signal from the signal OUT from the node 33 and also the input signal $\overline{IN}$ from the node 34. The control signal is in a high-impedance state while the signal OUT supplied from the node 33 is falling from a "H" level to a "L" level, is at the "H" level after the signal OUT has become stable at the "L" level, and is at the "L" level after the input signal $\overline{IN}$ has risen to the "H" level.

The operation of the circuit shown in FIG. 3 will now be explained. Assume that the input signals IN and $\overline{IN}$ are at the "L" level and the "H" level, respectively, and that the output signal OUT is stable at the "H" level. When the input signals IN and $\overline{IN}$ change to the "H" level and the "L" level, respectively, the MOS transistor 37 and the bipolar transistor 32 are turned on and off, respectively. Then, a base current flows from the node 33, which is at the "H" level, to the bipolar transistor 35. As a result of this, the bipolar transistor 35 is turned on, discharging the node 33 to the ground potential GND, whereby the output signal OUT falls from the "H" level to the "L" level.

When the output signal OUT falls from the "H" level to the "L" level, the control signal output by the detector circuit 41 is set into the high-impedance state. The MOS transistor 40 is, therefore, off. Hence, it is only the bipolar transistor 35 that discharges the node 33 while the output signal OUT is falling from the "H" level to the "L" level. The node 33 is fast discharged since the bipolar transistor 35 has great current-accumulating ability. In addition, the bipolar transistor 35 absorbs the ringing component contained in the output signal OUT since the MOS transistor 40 is off.

As the output signal OUT approaches a level close to the ground potential GND, the control signal output by the detector circuit 41 rises to the "H" level. Hence, the MOS transistor 40 forms a new discharging path for the node 33, in addition to the discharging path formed of the bipolar transistor 35. In this case, the node 33 is discharged with an extremely large sink current.

When the input signals IN and $\overline{IN}$ change to the "L" level and the "H" level, respectively, the bipolar transistor 32 is turned on. The node 33 is gradually charged with the power-supply potential VCC. As a result of this, the output signal OUT starts rising to the "H" level. At this time, the MOS transistor 37 is cut off and the control signal output by the detector circuit 41 falls to the "L" level. The node 33 is, therefore, no longer discharged through the discharging path formed of the bipolar transistor 35 and the discharging path formed of the MOS transistor 40. Once the bipolar transistor 35 is cut off, its base is fast discharged to the ground potential GND by means of the pull-down circuit 39. Hence, no DC currents are generated which will flow through the bipolar transistor 32 or the bipolar transistor 35.

In the signal output circuit shown in FIG. 3, the node 33 is discharged to the "L" level while the bipolar transistor 35 remains on. Therefore, the generating of the ringing component in the output signal OUT can be suppressed well. Further, the signal output circuit has a sufficiently great ability to drive a load since not only the bipolar transistor 35 but also the MOS transistor 40 is turned on, thus discharging the node 33, when the level of the output signal OUT approaches the "L" level. Still further, the circuit consumes as little power as does an ordinary CMOS integrated circuit since a DC current does not always flow between the power-supply potential VCC and the ground potential GND.

With reference to FIG. 4, the pull-down circuit 39 and the detector circuit 41, both shown in FIG. 3, will now be described in detail.

As is illustrated in FIG. 4, the pull-down circuit 39 is comprised of an N-channel MOS transistor 42. The MOS transistor 42 has a drain coupled to the base of the bipolar transistor 35, a source connected to the node 36 applied with the ground potential GND, and a gate coupled to the node 34 supplied with the input signal $\overline{IN}$. The detector circuit 41 comprises two P-channel MOS transistors 43 and 44 and one N-channel MOS transistor 45. The source and gate of the P-channel MOS transistor 43 are coupled to the node 31 applied with the power-supply potential VCC and the node 33 for outputting the signal OUT, respectively. The source, drain and gate of the P-channel MOS transistor 44 are coupled to the drain of the MOS transistor 43, the gate of the MOS transistor 40, and the node 34 for receiving the input signal $\overline{IN}$, respectively. The drain, source and gate of the N-channel MOS transistor 45 are coupled to the drain of the MOS transistor 44, the node 36, and the node 34, respectively. The MOS transistors 44 and 45 constitute a CMOS inverter 46. The P-channel MOS transistor 43 functions as a switch which is controlled by the output signal OUT. The source-drain path of this MOS transistor 43 is connected between the inverter 46 and the node 31 applied with the power-supply potential VCC.

In operation, when the input signal IN falls to the "L" level, and the MOS transistor 37 is turned of, the MOS transistor 42 is turned on. As a result, the base of the bipolar transistor 35 is discharged to the ground potential GND. Hence, the MOS transistor 42 functions as a pull-down circuit.

The P-channel MOS transistor 43 incorporated in the detector circuit 41 is off while the output signal OUT at the node 33 remains at the "H" level. Hence, even if the input signal $\overline{IN}$ falls to the "L" level, turning on the P-channel MOS transistor 44, the output of the detector circuit 41 remains at high impedance. When the output signal OUT falls from the power-supply potential VCC to a level below the absolute value of the threshold voltage of the transistor 43, because to the discharging of the bipolar transistor 35, the transistor 43 is turned on, whereby the control signal output by the circuit 41 rises to the "H" level. As a result of this, the MOS transistor 40 is turned on, and cooperates with the bipolar transistor 35 to discharge the node 33. Conversely, when the input signal $\overline{IN}$ rises from the "L" level to the "H" level, the N-channel MOS transistor 45 is immediately turned on. In this case, the control signal falls to the "L" level. The N-channel MOS transistor 40 is therefore turned off and no longer function as a discharge path for the node 33.

FIG. 5 illustrates a signal output circuit which is a second embodiment of the present invention. The parts which corresponds to those shown in FIGS. 3 and 4 are designated in FIG. 5 by like characters, and will not be described. Only the characterizing features of the second embodiment will be described in detail, with reference to FIG. 5.

The signal output circuit of FIG. 5 is characterized by the detector circuit 41. The circuit 41 included a resistor 47 which is connected between the drain of the P-channel MOS transistor 44 and the node of the drain of the N-channel MOS transistor 45 and the gate of the N-channel MOS transistor 40. The resistor 47 adjusts the timing of turning on the transistor 40 while the node 33 is being discharged. The higher the resistance of this resistor 47, the longer it takes to turn on the transistors 43 and 44, and the more slowly the gate of the transistor 40 is charged with the power-supply potential VCC. After all, the higher the resistance of the resistor 47, the more the timing of turning on the transistor 40 is delayed.

FIG. 6 shows a signal output circuit according to a third embodiment of the present invention. The parts which corresponds to those shown in FIGS. 3 and 4 are designated in FIG. 6 by like characters, and will not be described. The circuit shown in FIG. 6 has a detector circuit 41 which can drive the gate of the N-channel MOS transistor 40 more efficiently than the detector circuits illustrated in FIGS. 4 and 5.

As has been pointed out, to enhance the ability of the signal output circuit to drive the load (not shown) connected to the node 33, it suffices to use a MOS transistor having a greater gate width as transistor 40. When the transistor 40 has a great gate width for this purpose, it is required that the load-driving ability of the detector circuit 41 be increased proportionally. In order to increase the load-driving ability of the CMOS inverter 46 incorporated in the detector circuit 41, it suffices to use larger elements for the transistors 44 and 45. Use of larger elements, however, leads to an increase in the chip area of the circuit. Therefore, a Bi-CMOS inverter, not a CMOS inverter, is used in the signal output circuit shown in FIG. 6, so that the circuit may operate at high speed and may yet have an adequately small chip area.

As is specifically illustrated in FIG. 6, the detector circuit 41 has an additional component, i.e., a Bi-CMOS inverter comprised of a CMOS inverter 50 and an NPN-type bipolar transistor 51. The CMOS inverter 50 is formed of a P-channel MOS transistor 48 and an N-channel MOS transistor 49, and is connected between the drain of a P-channel MOS transistor 43 and a node 36. An input signal $\overline{IN}$ is supplied to the input of the CMOS inverter 50. The NPN-type bipolar transistor 51 has its collector-emitter path connected between the gate of an N-channel MOS transistor 40 and a node 31 applied with the power-supply potential VCC. The base of the transistor 51 is connected to receive the output of the CMOS inverter 50.

The combination of the CMOS inverter 50 and the NPN-type bipolar transistor 51 having a great current-accumulating ability serves to prevent an increase in the chip size of the signal output circuit.

It should be noted that, also in the third embodiment (FIG. 6), the pull-down circuit 39 is comprised of an N-channel MOS transistor 42.

As has been described, the present invention can provide a signal output circuit which has a great ability of driving a load and can yet suppress the ringing component contained in an output signal, and can also provide a signal output circuit which consumes as little power as does a CMOS integrated circuit.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A signal output circuit having a bipolar transistor at an output, for use in a CMOS integrated circuit, said signal output circuit comprising:
    a first node for outputting a signal;
    a second node to which a first power-supply potential is applied;
    a first bipolar transistor of a first polarity having a base and collector-emitter path connected between said first and second nodes;
    a first MOS transistor of the first polarity having a source-drain path connected between said first node and the base of said first bipolar transistor, and controlled by a first input signal;
    a second MOS transistor of the first polarity having a gate and a source-drain path connected between said first and second nodes; and
    a control signal generating means for generating and supplying a control signal to the gate of said second MOS transistor, whereby said second MOS transistor is off while the output signal at said first node is falling to a predetermined level between a first voltage corresponding to a high logical level and a second voltage corresponding to a low logical level, and said second MOS transistor is on after the output signal falls below the predetermined level.

2. The circuit according to claim 1, further comprising a third node to which a second power-supply potential is applied, and the second bipolar transistor of the first polarity having a collector-emitter path connected between said third node and said first node and controlled by a second input signal.

3. The circuit according to claim 1, wherein said control signal generating means comprises signal-inverting means for receiving the second input signal and supplying an output to the gate of said second MOS transistor, and switch means connected between said third node and said signal-inverting means and controlled by the signal at said first node.

4. The circuit according to claim 3, wherein said switch means is comprised of a third MOS transistor of a second polarity having source-drain path connected between said third node and said signal-inverting means, and a gate connected to receive the signal at said first node.

5. The circuit according to claim 2, wherein said control signal generating means comprises:
    a fourth MOS transistor of the second polarity having a source-drain path connected, at one end, to said third node, and a gate connected to said first node;
    a fifth MOS transistor of the second polarity having a source-drain path connected, at one end, to the other end of the source-drain path of said fourth MOS transistor, and a gate connected to receive the second input signal; and
    a sixth MOS transistor of the first polarity having a source-drain path connected, at one end, to the other end of said fifth MOS transistor, and at the other end, to said second node, and a gate connected to receive the second input.

6. The circuit according to claim 5, further comprising a resistor connected between the other end of the source-drain path of said fifth MOS transistor and one end of the source-drain path of said sixth MOS transistor.

7. The circuit according to claim 1, further comprising discharge control means connected between the base of said first bipolar transistor and said second node, for discharging the base potential of said first bipolar transistor when said first bipolar transistor is turned off.

8. The circuit according to claim 7, wherein said discharge control means is comprised of a seventh MOS transistor of the first polarity having a source-drain path connected between the base of said first bipolar transistor and said second node, and a gate connected to receive the first input signal.

9. The circuit according to claim 2, wherein said control signal generating means comprises:
    first signal-inverting means for receiving the second signal and supplying a output to the gate of said second MOS transistor;
    a third bipolar transistor of the first polarity having a collector-emitter path connected between said third node and the gate of said second MOS transistor;
    a second signal-inverting means for receiving the second input and supplying an output to the base of said third MOS transistor; and
    switch means connected between said third node, and said first and second signal-inverting means, and controlled by the signal at said first node.

10. The claim according to claim 9, wherein said switch means is comprised of an eighth MOS transistor of the second polarity having a source-drain path connected between said third node, and said first and second signal-inverting means, and a gate connected to receive the signal at said first node.

11. The circuit according to claim 2, wherein said control signal generating means comprises:
    a ninth MOS transistor of a second polarity having a source-drain path connected, at one end, to said third node, and a gate connected to said first node;
    a tenth MOS transistor of the second polarity having a source-drain path connected, at one end, to the other end of the source-drain path of said ninth MOS transistor, and a gate connected to receive the second input signal;
    an eleventh MOS transistor of the first polarity having a source-drain path connected, at one end, to the other end of the source-drain path of said tenth MOS transistor and, at the other end, to said second node, and a gate connected to receive the second input signal;
    a twelfth MOS transistor of the second polarity having a source-drain path connected, at one end, to the other end of the source-drain path of said ninth MOS transistor, and a gate connected to receive the second input signal;
    a thirteenth MOS transistor of the first polarity having a source-drain path connected, at one end, to the other end of the source-drain path of said twelfth MOS transistor and, at the other end, to said second node, and a gate connected to receive the second input signal;

a third bipolar transistor of the first polarity having a collector-emitter path connected between said third node and the gate of said second MOS transistor, and a base connected to the other end of the source-drain path of said twelfth MOS transistor.

12. A signal output circuit having a bipolar transistor at output, for use in a CMOS integrated circuit, said signal output circuit comprising:

a first node for outputting a signal;

a second node to which a first power-supply potential is applied;

a third node to which a second power-supply potential is applied;

a first bipolar transistor of a first polarity having a base and collector-emitter path connected between said first node and said second node;

a first MOS transistor of the first polarity having a source-drain path connected between said first node and the base of said first bipolar transistor, and controlled by a first input signal;

a second MOS transistor of the first polarity having a gate and a source-drain path connected between said second node and the base of said first bipolar transistor, and controlled by a second input signal;

a second bipolar transistor of the first polarity having a collector-emitter path connected between said third node and said second node, and a base connected to receive the second input signal;

a third MOS transistor of the second polarity having a source-drain path connected, at one end, to said third node, and a gate connected to said first node;

a fourth MOS transistor of the second polarity having a source-drain path connected, at one end, to the other end of the source-drain path of said third MOS transistor, and a gate connected to receive the second input signal;

a fifth MOS transistor of the first polarity having a source-drain path connected, at one end, to the other end of the source-drain path of said fourth MOS transistor and, at the other end, to said second node, and a gate connected to receive the second input signal; and a sixth MOS transistor of the first polarity having a source-drain path connected between said first node and said second node, and a gate connected between the other end of the source-drain path of said fourth MOS transistor.

13. A signal output circuit having a bipolar transistor at output, for use in a CMOS integrated circuit, said signal output circuit comprising:

a first node for outputting a signal;

a second node to which a first power-supply potential is applied;

a third node to which a second power-supply potential is applied;

a first bipolar transistor of a first polarity having a base and collector-emitter path connected between said first node and said second node;

a first MOS transistor of the first polarity having a source-drain path connected between s id first node and the base of said first bipolar transistor, and controlled by a first input signal;

a second MOS transistor of the first polarity having a gate and a source-drain path connected between said second node and the base of said first bipolar transistor, and controlled by a second input signal;

a second bipolar transistor of the first polarity having a collector-emitter path connected between said third node and said second node, and a base connected to receive the second input signal;

a third MOS transistor of the second polarity having a source-drain path connected, at one end, to said third node, and a gate connected to said first node;

a fourth MOS transistor of the second polarity having a source-drain path connected, at one end, to the other end of the source-drain path of said third MOS transistor, and a gate connected to receive the second input signal;

a fifth MOS transistor of the first polarity having a source-drain path connected, at one end, to the other end of the source-drain path of said fourth MOS transistor and, at the other end, to said second node, and a gate connected to receive the second input signal; and a sixth MOS transistor of the second polarity having a source-drain path connected, at one end, to the other end of the source-drain path of said third MOS transistor, and a gate connected to receive the second input signal;

a seventh MOS transistor of the first polarity having a source-drain path connected, at one end, to the other end of the source-drain path of said sixth MOS transistor and, at the other end, to said second node, and a gate connected to receive the second input signal, an eighth MOS transistor of the first polarity having a source-drain path connected between said first node and said second node, and a gate connected to the other end of the source-drain path of said fourth MOS transistor; and a third bipolar transistor of the first polarity having a collector-emitter path connected between said third node and the gate of said eighth MOS transistor, and a base connected to the other end of the source-drain path of said sixth MOS transistor.

* * * * *